United States Patent
Perkins

(10) Patent No.: US 10,396,241 B1
(45) Date of Patent: Aug. 27, 2019

(54) DIFFUSION REVEALED BLOCKING JUNCTION

(71) Applicant: Apple Inc., Cupertino, CA (US)

(72) Inventor: James Michael Perkins, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 2 days.

(21) Appl. No.: 15/650,413

(22) Filed: Jul. 14, 2017

Related U.S. Application Data

(60) Provisional application No. 62/371,121, filed on Aug. 4, 2016.

(51) Int. Cl.
  *H01L 33/06* (2010.01)
  *H01L 33/14* (2010.01)

(52) U.S. Cl.
  CPC ............ *H01L 33/06* (2013.01); *H01L 33/145* (2013.01)

(58) Field of Classification Search
  CPC .............................. H01L 33/145; H01L 33/06
  See application file for complete search history.

(56) References Cited

U.S. PATENT DOCUMENTS

| | | | |
|---|---|---|---|
| 6,687,276 B2 | 2/2004 | Tanaka | |
| 8,551,797 B2 | 10/2013 | Abe | |
| 8,615,026 B2 | 12/2013 | Taniguchi | |
| 9,865,772 B2 * | 1/2018 | Bour | H01L 33/145 |
| 2007/0145381 A1 * | 6/2007 | Unno | H01L 33/145 257/79 |
| 2013/0221320 A1 * | 8/2013 | Li | H01L 33/145 257/9 |
| 2013/0270520 A1 * | 10/2013 | Ishizaki | H01L 33/06 257/13 |
| 2015/0187991 A1 * | 7/2015 | McGroddy | H01L 27/016 257/13 |
| 2016/0197232 A1 * | 7/2016 | Bour | H01L 33/20 257/13 |
| 2016/0315218 A1 * | 10/2016 | Bour | H01L 33/20 |
| 2017/0170360 A1 * | 6/2017 | Bour | H01L 33/145 |
| 2017/0207365 A1 * | 7/2017 | Grundmann | H01L 33/007 |
| 2017/0229606 A1 * | 8/2017 | Kim | H01L 33/002 |
| 2017/0229609 A1 * | 8/2017 | Michiue | H01L 33/06 |
| 2017/0229612 A1 * | 8/2017 | Shatalov | H01L 33/22 |
| 2017/0345968 A1 * | 11/2017 | Sun | H01L 33/06 |
| 2017/0358714 A1 * | 12/2017 | Seong | H01L 33/06 |

OTHER PUBLICATIONS

Deppe et al., "Atom diffusion and impurity-induced layer disordering in quantum well III-V semiconductor heterostructures," J. Appl. Phys. 64 (12), 15 Dec. 15, 1988, pp. R93-R113.

* cited by examiner

*Primary Examiner* — Allen L Parker
*Assistant Examiner* — Charles N Ausar-El
(74) *Attorney, Agent, or Firm* — Jaffery Watson Mendonsa & Hamilton LLP

(57) ABSTRACT

LEDs and methods of fabrication are described. The LEDs may include a diffusion revealed blocking junction within a cladding layer in order to confine current within an interior of the LED, and mitigate non-radiative recombination at the LED sidewalls.

14 Claims, 12 Drawing Sheets

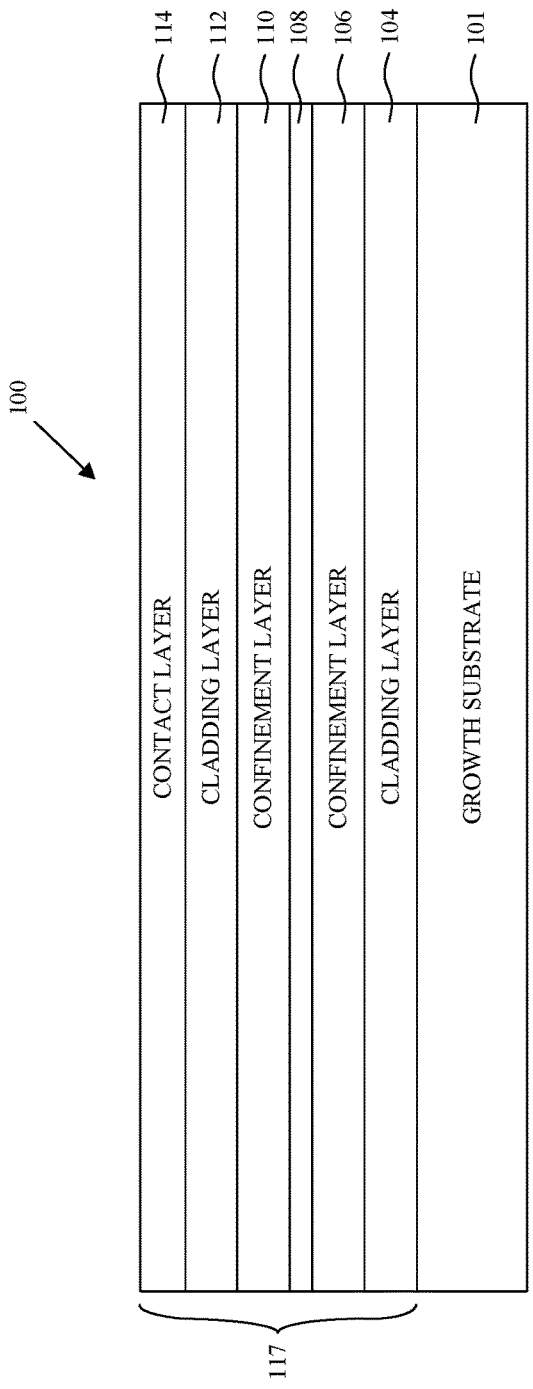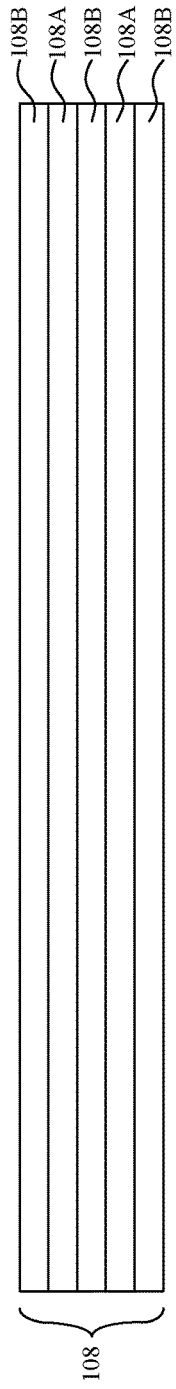
FIG. 2A
FIG. 2B

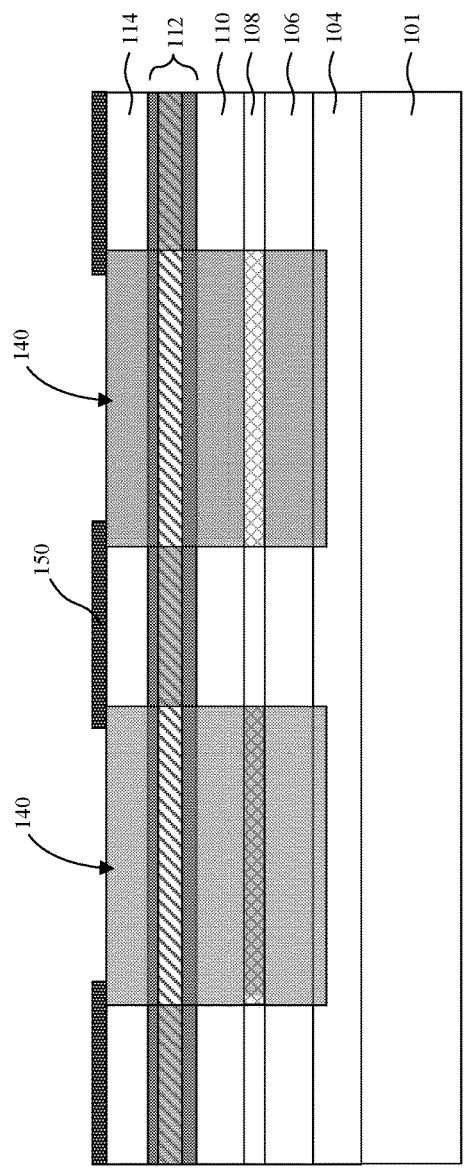
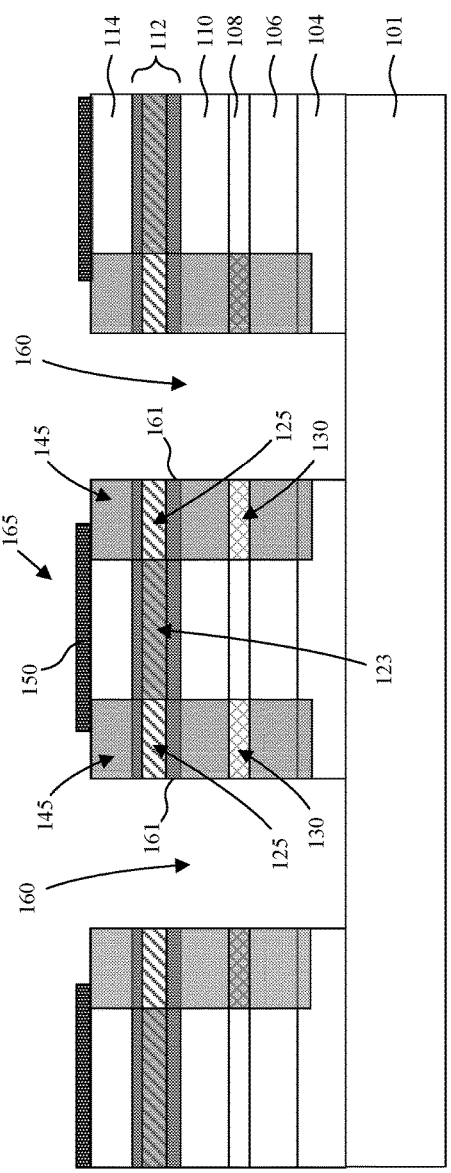
FIG. 6
FIG. 7

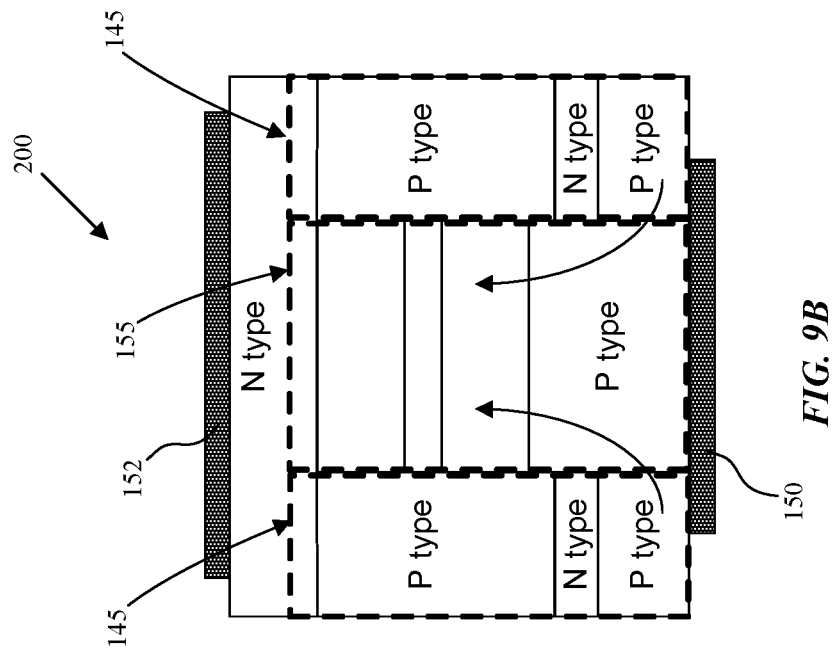
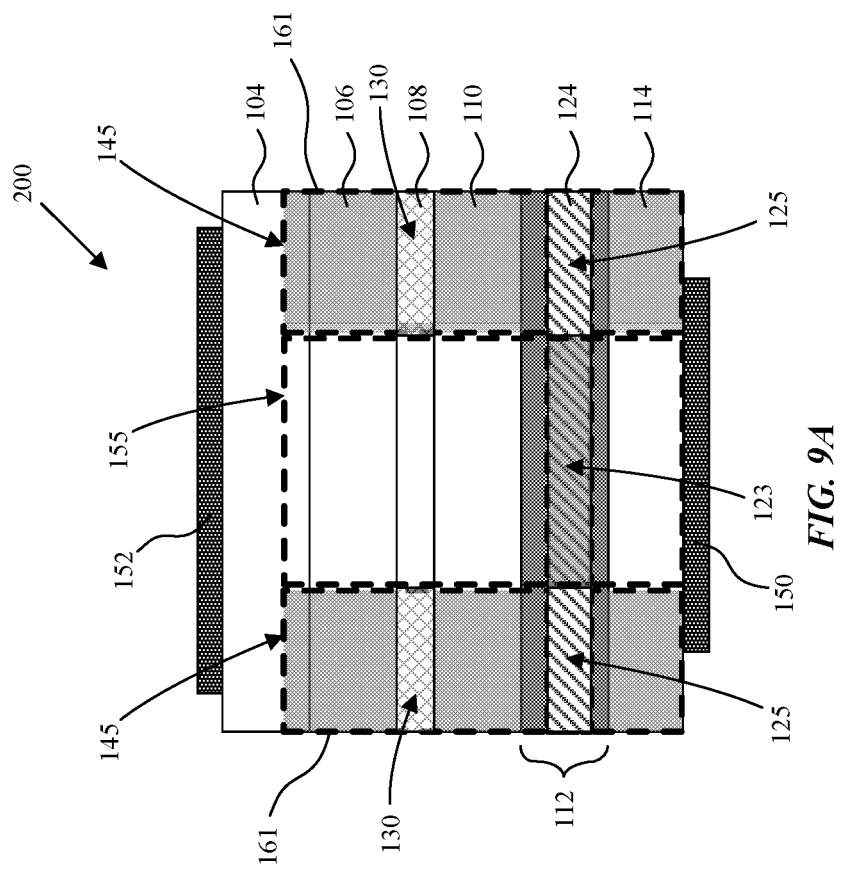
FIG. 9B
FIG. 9A

DIFFUSION REVEALED BLOCKING JUNCTION

RELATED APPLICATIONS

This application claims the benefit of priority from U.S. Provisional Application No. 62/371,121, filed on Aug. 4, 2016, which is herein incorporated by reference.

BACKGROUND

Field

Embodiments described herein relate to light emitting diodes (LEDs). More particularly, embodiments relate to LED structures and methods of manufacture to mitigate non-radiative recombination at the LED sidewalls.

Background Information

LEDs are increasingly being considered as a replacement technology for existing light sources as demand is increasing for higher resolution displays, as well as for thinner, lighter weight, and lower cost electronic devices. More recently, it has been proposed to incorporate emissive inorganic semiconductor-based LEDs into high resolution displays.

SUMMARY

Embodiments describe LEDs and methods of fabrication in which the LEDs may include a diffusion revealed blocking junction in order to confine current within an interior of the LED, and mitigate non-radiative recombination at the LED sidewalls. The LED may include a current confinement region that completely laterally surrounds a current injection region. In accordance with embodiments, the current confinement region includes a dopant concentration which overlaps the diffusion revealed blocking junction of the LED. The dopant concentration may additionally overlap an intermixed region within the originally grown active layer, with the intermixed region characterized by a higher bandgap than the as-grown quantum well layers within the active layer in the current injection region. The LEDs in accordance with embodiments may be micro LEDs, and may be fabricated utilizing a "mesa last" top-down diffusion sequence, as well as a "mesa first" sidewall diffusion sequence.

BRIEF DESCRIPTION OF THE DRAWINGS

FIGS. 2A-2B are schematic cross-sectional side view illustrations of a bulk LED substrate in accordance with an embodiment.

FIG. 6 is a schematic cross-sectional side view illustration of the formation of bottom contacts in accordance with an embodiment.

FIG. 7 is a schematic cross-sectional side view illustration of the formation of mesa trenches in accordance with an embodiment.

FIG. 9A is a schematic cross-sectional side view illustration of an LED including a revealed blocking junction and intermixed region in accordance with an embodiment.

FIG. 9B is a schematic cross-sectional side view illustration of the LED in FIG. 9A illustrating net dopant types in accordance with an embodiment.

DETAILED DESCRIPTION

Figure 1:
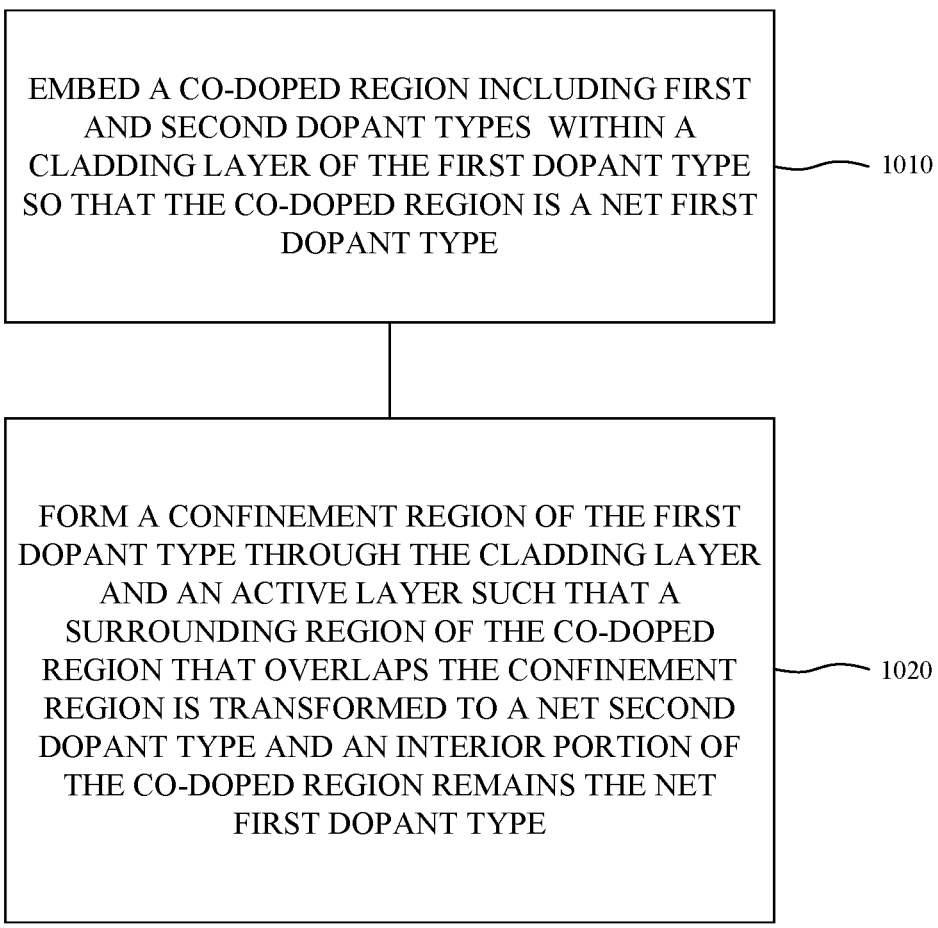
FIG. 1 is a flow chart illustrating a method of revealing a blocking junction in accordance with an embodiment.

Embodiments describe LEDs and methods of forming LEDs with various structural configurations to mitigate non-radiative recombination at the LED sidewalls. In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "to", "between", "spanning" and "on" as used herein may refer to a relative position of one layer with respect to other layers. One layer "over", "spanning" or "on" another layer or bonded "to" or in "contact" with another layer may be directly in contact with the other layer or may have one or more intervening layers. One layer "between" layers may be directly in contact with the layers or may have one or more intervening layers.

It has been observed that the sidewalls for emissive LEDs may represent non-radiative recombination sinks for injected carriers. This may be due to the sidewalls being characterized by unsatisfied bonds, chemical contamination, and structural damage (particularly if dry-etched). Injected carriers recombine non-radiatively at states associated with these defects. Thus, the perimeter of an LED may be optically dead, and the overall efficiency of the LED is reduced. This non-radiative recombination can also be a result of band bending at the surface leading to a density of states where electrons and holes can be confined until they combine non-radiatively. The characteristic distance over which the sidewall surface effect occurs is related to the carrier diffusion length, which may typically be 1-10 µm in some applications in accordance with embodiments. Thus, the efficiency degradation is particularly severe in micro LEDs in which the LED lateral dimensions approach the carrier diffusion length. Such non-radiative recombination may have a significant effect on LED device efficiency, particularly when the LED is driven at low current densities in the pre-droop region of its characteristic internal quantum efficiency (IQE) curve where the current is unable to saturate the defects.

In some embodiments, the term "micro" LED as used herein may refer to the descriptive size, e.g. length or width, of the LED. In some embodiments, "micro" LEDs may be on the scale of 1 µm to approximately 300 µm, or 100 µm or less in many applications. More specifically, in some embodiments, "micro" LEDs may be on the scale of 1 µm to 20 µm, such as 1-10 µm or 5 µm where the LED lateral dimensions approach the carrier diffusion length. However, it is to be appreciated that embodiments are not necessarily so limited, and that certain aspects of the embodiments may be applicable to larger, and possibly smaller size scales.

In an embodiment, an LED includes laterally opposite sidewalls, a p-doped cladding layer (e.g. Mg region $1\times10^{18}$ $cm^{-3}$) spanning between the laterally opposite sidewalls, an active layer over the p-doped cladding layer and spanning between the laterally opposite sidewalls, an n-doped cladding layer over the active layer and spanning between the laterally opposite sidewalls, and a co-doped region (e.g. including Si doping concentration of $5\times10^{17}$ $cm^{-3}$ and the Mg doping concentration $1\times10^{18}$ $cm^{-3}$ of the p-doped cladding layer) embedded within the p-doped cladding layer and spanning between the laterally opposite sidewalls. A current injection region is located within the laterally opposite sidewalls, and a current confinement region laterally surrounds the current injection region and spans along the laterally opposite sidewalls. In an embodiment, the current confinement region includes a p-type dopant concentration (e.g. Zn region $1\times10^{17}$ $cm^{-3}$) extending through the p-doped cladding layer, and the active layer. In an embodiment, the co-doped region and the current confinement region overlap to form a net n-type blocking junction within the p-doped cladding layer, and the co-doped region overlaps the current injection region to form a net p-type region within the p-doped cladding layer.

In one aspect, specific processing techniques are described to reveal the blocking junctions with diffusion. In an embodiment illustrated in FIG. 1, a method of revealing a blocking junction includes at operation 1010 embedding a co-doped region including first and second dopant types within a cladding layer of the first dopant type so that the co-doped region is a net first dopant type. At operation 1020 a confinement region of the first dopant type is formed through the cladding layer and an active layer such that a surrounding region of the co-doped region that overlaps the confinement region is transformed to a net second dopant type and an interior portion of the co-doped region remains the net first dopant type. Moreover, in an embodiment, a net n-type blocking junction may be revealed after the diffusion of a p-type dopant (e.g. zinc) into a co-doped region, which is net p-type prior to diffusion of the p-type dopant. The resulting n-type blocking junction may be part of a PNP current-blocking junction within the current confinement region.

In another aspect, p-dopant diffusion within the current confinement region can facilitate intermixing between the barrier layer(s) and quantum well layer(s) within an active layer to form an intermixed region with a higher band gap than the quantum well layers within the current injection region. For example, this may be attributed to the intermixed region (of the active layer overlapping the current confinement region) having a higher concentration of Al than each of the plurality of quantum well layers. Thus, in an embodiment, the original as-grown quantum well layers within the current injection region become interior quantum well layers and portions of the surrounding intermixed regions (corresponding to a transformed portion of the original as-grown quantum well layers and barrier layers) include more Al than the remaining interior quantum well layers.

In one aspect, in accordance with some embodiments, the current confinement region is created by the diffusion of Zn (i.e. the dopant concentration), and fundamental mechanisms governing Zn diffusion and intermixing are leveraged to reveal the blocking junctions and/or quantum well intermixing. Zn is a group-II element. In a III-V compound semiconductor Zn will substitute for a group III atom. Substitutional Zn (i.e., Zn occupying a group III site such as an Al, Ga, or In lattice site in III-V compositions such as AlInP, AlGaInP, AlGaAs) is an acceptor. When a semiconductor is doped p-type, for example a MN semiconductor doped with Mg or Zn, it becomes energetically favorable to form compensating native defects. In the p-type cubic MN materials, the group-III interstitial acts as such a compensating donor. Thereby, it is expected that the group-III interstitial defects are easily formed in p-type material.

Interstitial atoms typically diffuse very rapidly, as they are relatively unrestrained by chemical bonds. In an embodiment encompassing diffusion of Zn into an AlInGaP heterostructure, the Zn diffusion may proceed as follows. First, a high surface concentration of Zn is established from either a solid Zn-containing film applied to the surface, or by immersion in a Zn-rich vapor. The concentration gradient at the surface, along with an elevated temperature, will drive Zn diffusion into the underlying material. In the Mg-doped p-type III-V layers, group-III interstitials are easily formed. The group-III atoms include Al, In, Ga, and the Mg acceptors. As the Zn diffuses into these materials, they become more p-type. In response, even more group-III interstitials are formed. There exists a dynamic equilibrium governing the group-III interstitial formation and diffusion, whereby the group-III atoms are constantly jumping from a group-III lattice site to an interstice, diffusing interstitially, and dropping into a group-III site and reforming chemical bonds. This process is known as a "kick-out" mechanism, since it is active in p-type material (where group-III interstitials are easily formed); and it occurs when a diffusing Zn interstitial atom displaces a group III atom from its lattice site. Thereby the Zn interstitial and the group-III atom exchange places, so that the group-III atom is displaced to the interstitial position and the Zn atom is absorbed into a group-III site. Thus, the Zn atom has "kicked-out" the group-III atom from its site. The group-III interstitial formed in this manner may easily diffuse from this position. This movement of the group-III atoms will homogenize the atoms comprising the group-III sublattice. In accordance with embodiments, this causes the active layer heterostructure intermixing in the quantum well layers and barrier layers. The kick-out mechanism also displaces the as-grown Mg acceptor atoms from their original group-III sites, into interstitial sites. The interstitial Mg is free to diffuse through the lattice. Since the diffusion ambient does not include Mg, there is no positive surface concentration gradient at the surface, as there is for Zn. Consequently the Mg may evaporate from the free surface. It is believed that the Mg evaporation from the surface produces a negative surface concentration gradient that causes diffusion from the bulk, toward the surface. Eventually the Mg within the current confinement region may be reduced, or possibly completely eliminated by diffusion to the surface and subsequent evaporation. In this manner, the Zn diffusion may reduce or eliminate the original Mg doping. In accordance with embodiments, it has been observed that the Zn diffusion displaces the Mg, such that the Mg is less than 10% of the original Mg concentration (e.g. less than 10% of the Mg concentration within the co-doped region, the p-type cladding layer, and/or the p-type contact layer that overlap the current injection region).

In accordance with embodiments, after Zn diffusion is completed, the final Zn concentration may be determined in part by the Zn diffusion conditions (temperature, Zn concentration in the vapor, etc.). For revealing the blocking junction, the design criteria governing the doping may include: (1) Mg acceptor concentration sufficient for reasonable p-type conductivity; (2) the compensating donor concentration (e.g. Si) does not fully compensate the Mg acceptors, i.e., the co-doped region layer is still net p-type as-grown; (3) the doping concentrations are controlled with sufficient margins; (4) the compensating donor concentration (e.g. Si) should be sufficiently high in the as-grown co-doped region that the region becomes n-type after Zn diffusion (that is, after displacement of Mg and incorporation of diffused Zn acceptors); (5) in concert with the compensating donor concentration, the Zn diffusion conditions are adjusted to satisfy this condition of type-conversion; (6) to serve as a blocking junction, the co-doped region is ideally thick enough to accommodate the depletion from both interfaces (top/bottom); and (7) a post-diffusion thermal anneal may also be employed in revealing the blocking junction, to further adjust the distribution/concentration of Zn.

In the following description exemplary processing sequences and structures are described for forming LEDs. Referring now to FIG. 2A, a cross-sectional side view illustration is provided of a bulk LED substrate 100 in accordance with an embodiment of the invention. The bulk LED substrate 100 structure may be applicable to a variety of compositions and designed emission spectra. For example, the bulk LED substrate 100 may include III-V nitride materials or III-V phosphide materials and designed for emission of a variety of emission spectra. For example, the bulk LED substrate 100 may fabricated with an AlInGaP material system. In a specific embodiment, the bulk LED substrate 100 is based on an AlInGaP material system and is designed for red color emission. For example, bulk LED substrate 100 may be designed for a peak emission wavelength between 600 nm-750 nm, such as 625 nm. While the following structures are described with regard to an AlInGaP material system, the exemplary structures and concepts may be used for LEDs and electronic devices based on alternative material systems such as group-III-V arsenide materials.

In one embodiment, formation of the bulk LED substrate 100 begins with the formation of a device layer 117 on a growth substrate 101, such as a GaAs growth substrate, for example with a thickness of 250-1,000 µm. Growth substrate 101 may optionally be doped, for example with an n-type dopant such as silicon (Si) or tellurium (Te). Layers 104-114 of the device layer 117 may be grown on the growth substrate 101 using a suitable technique such as metal organic chemical vapor deposition (MOCVD). As shown, an n-type cladding layer 104 is grown on the growth substrate 101, for example to a thickness of 0.05-0.5 µm. Optionally, an n-type contact layer (e.g. AlInGaP, with Si or Te dopant concentration of $0.5\text{-}4\times10^{18}$ $cm^{-3}$) may be grown on the growth substrate prior to the n-type cladding layer 104. N-type cladding layer 104 may be formed of materials such as AlInP, AlGaInP, and AlGaAs. In an embodiment, n-type cladding layer 104 is formed of AlInP with a Si dopant concentration of $1\times10^{18}$ $cm^{-3}$. An n-side (top) confinement layer 106 is then grown on the n-type cladding layer 104, for example to a thickness of 0.05-0.5 µm. N-side confinement layer 106 may be formed of materials such as AlInP, AlGaInP, and AlGaAs. In an embodiment, n-side confinement layer 106 is formed of AlInGaP, and is unintentionally doped during growth. In an embodiment, the n-side confinement layer 106 does not have a graded composition (e.g. Aluminum content is uniform). An active region 108 is then grown on the n-side confinement layer 106. Active region 108 may include one or more quantum well (QW) layers or bulk active layers. In an embodiment illustrated in FIG. 2B, the one or more quantum well layers 108A or bulk active layers are formed of AlGaAs, InGaP or AlInGaP, separated by barrier layers 108B, which may be of the same alloy composition (e.g. AlInGaP) as one of the surrounding confinement layers. A p-side (bottom) confinement layer 110 is then optionally grown on the active layer 108, for example to a thickness of 0.05-0.5 µm, or more specifically approximately 100 nm. P-side confinement layer 110 may be formed of materials such as AlInP, AlGaInP, and AlGaAs. In an embodiment, p-side confinement layer 110 is formed of AlInGaP, and is unintentionally doped during growth. A p-type (bottom) cladding layer 112 may then be formed on the p-side confinement layer 110. The p-type cladding layer 112 may be formed of materials such as AlInP, AlGaInP, and AlGaAs. In an embodiment, p-type cladding layer 112 is formed of AlInP with a Mg dopant concentration of $5\times10^{17}$ $cm^{-3}\text{-}1.5\times10^{18}$ $cm^{-3}$, such as $1\times10^{18}$ $cm^{-3}$. In an embodiment, the p-type cladding layer 112 may have a substantially uniform p-dopant concentration, less a concentration gradient due to diffusion with the surrounding layers. In an embodiment, the p-dopant concentration is not uniform. For example, doping may begin after a specific set back distance, such as 100-200 nm into the p-type cladding layer 112. In an embodiment, the p-type cladding layer 112 may include an embedded co-doped region, as described in more detail with regard to FIG. 3. A p-type contact layer 114 is then optionally grown on the p-type cladding layer 112, for example to a thickness of 0.1-50.0 µm, for example to 0.1-1.5 µm for a thinner LED. In an embodiment, the optional p-type contact layer 114 is formed of GaP or GaAs, for example, with a Mg, Zn, or C dopant concentration of $1\times10^{18}$ $cm^{-3}\text{-}1\times10^{19}$ $cm^{-3}$.

In accordance with embodiments, the confinement layers 106, 110 may be formed of a material with a large conduction band offset with respect to the one or more quantum well layers in the active layer 108. In this aspect, a maximum conduction band offset to the quantum wells confines electrons to the quantum wells. In accordance with embodiments, the doped cladding layers 104, 112 may be selected to have a high band gap in order to confine the injected carriers. For example, the doped cladding layers 104, 112 may have a higher bandgap energy than the adjacent confinement layers. In an embodiment, the confinement layers 106, 110 are $(Al_xGa_{1-x})_{0.5}In_{0.5}P$ alloys with $0.2 \leq x \leq 0.8$, such as $0.5 \leq x \leq 0.8$. In an embodiment, the doped cladding layers 104, 112 are $(Al_xGa_{1-x})_{0.5}In_{0.5}P$ alloys with $0.6 \leq x \leq 1.0$.

Figure 3:
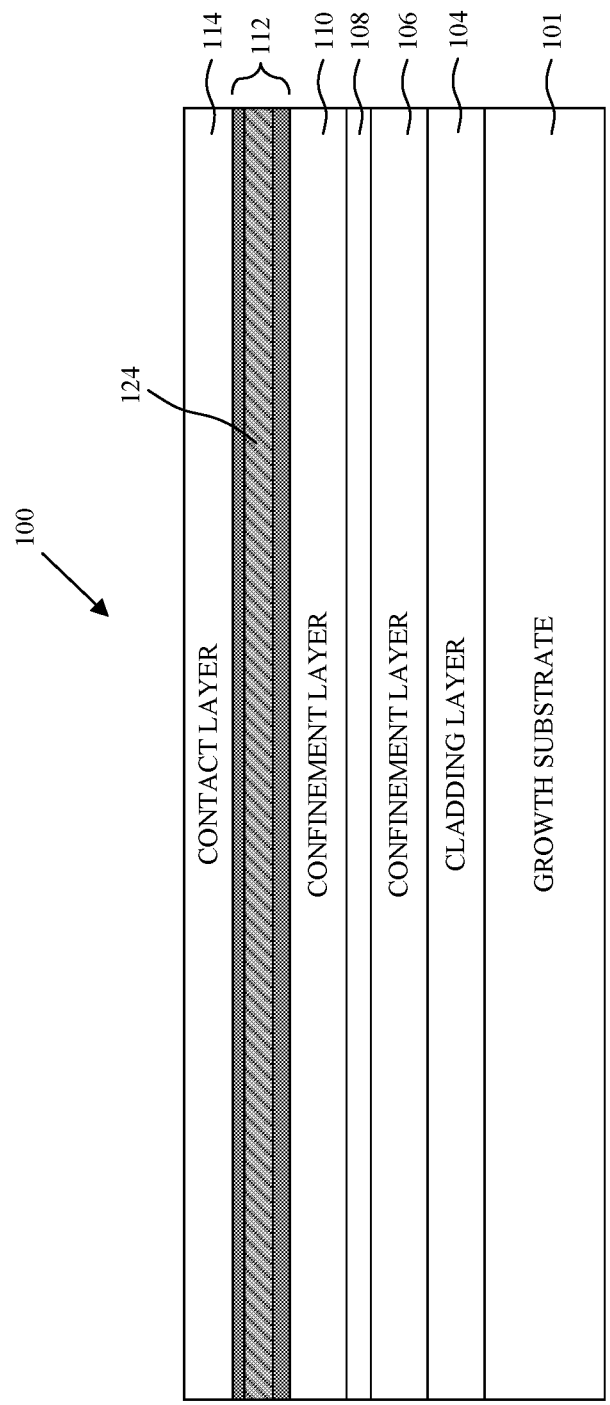
FIG. 3 is a schematic cross-sectional side view illustration of a bulk LED substrate including an embedded co-doped region in accordance with an embodiment.

Referring now to FIG. 3, a cross-sectional side view illustration is provided of a bulk LED substrate 100 in accordance with an embodiment of the invention. The bulk LED substrate 100 illustrated in FIG. 3 is similar to that illustrated and described with regard to FIGS. 2A-2B, with one difference being the illustration of a co-doped region 124 embedded within the cladding layer 112. In accordance with embodiments, the cladding layer 112 may be a doped cladding layer. For example, cladding layer 112 may be a p-type cladding layer, and doped with a dopant such as Mg. The co-doped region 124 may include both p-dopants (e.g. Mg) and n-dopants (e.g. Si or Te). In an embodiment, the co-doped region 124 has an n-dopant concentration that is less than the p-dopant concentration. For example, co-doped region 124 may have an n-dopant concentration of approximately $5 \times 10^{17}$ cm$^{-3}$, and a p-dopant concentration of greater than $5 \times 10^{17}$ cm$^{-3}$ to $1.5 \times 10^{18}$ cm$^{-3}$, such as $1 \times 10^{18}$ cm$^{-3}$. In a specific embodiment, the n-dopant is Si, and the p-dopant is Mg. The co-doped region 124 may be formed in-situ, by flowing the n-type and p-type dopant sources simultaneously during growth of the cladding layer 112. In accordance with embodiments, the n-dopant (donor) concentration may be sufficiently high that the co-doped region 124 is net p-type as grown, yet can be rendered net n-type after diffusion of the p-dopant (e.g. Zn) concentration when forming the current confinement region. In interests of illustrating the net dopant type of the co-doped region 124, the cladding layer 112 is shaded to illustrate p-type doping, and the co-doped region 124 is illustrated with hashed lines to illustrate n-doping and shaded to illustrated net p-type doping.

The bulk LED substrate 100 may then be processed to form an array of LEDs with revealed blocking junctions using various processing sequences, such as "mesa last" top-down diffusion or "mesa first" sidewall diffusion processing sequences.

Figure 4:
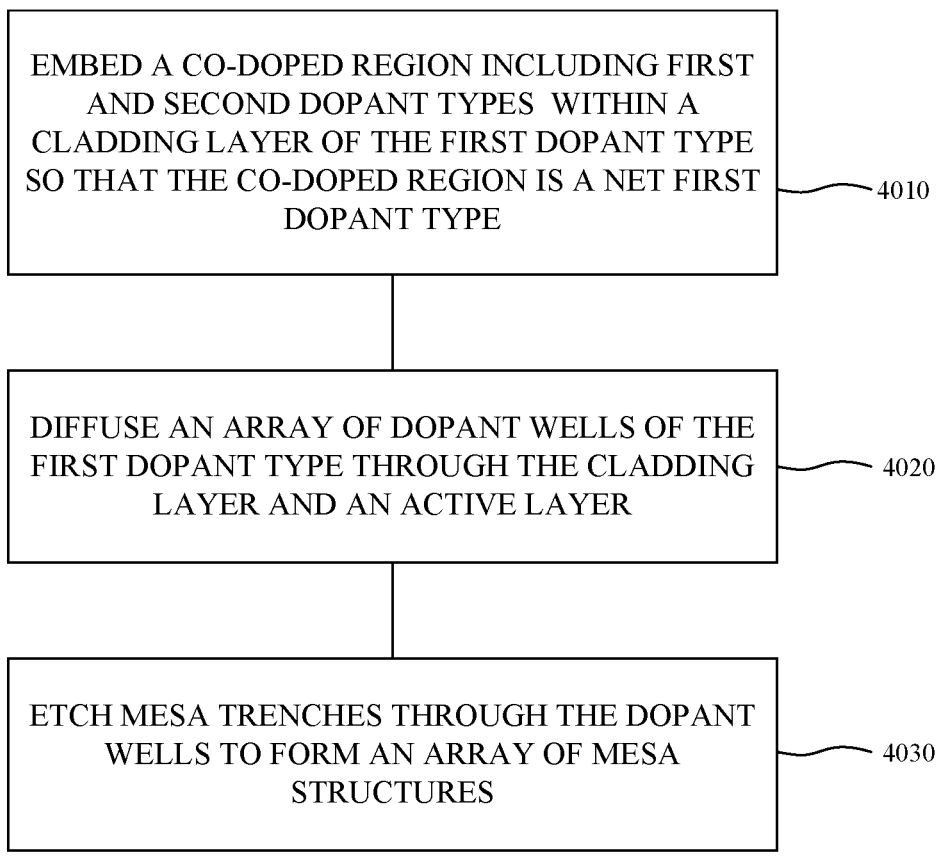
FIG. 4 is a flow chart illustrating a method of revealing a blocking junction with top down diffusion in accordance with an embodiment.

FIG. 4 is a flow chart illustrating a method of revealing a blocking junction with a "mesa last" top down diffusion in accordance with an embodiment. At operation 4010 a co-doped region 124 including first and second dopant types is embedded within a cladding layer 112 of the first dopant type (e.g. p-type) so that the co-doped region is a net first dopant type (p-type). Operation 4010 was previously described with regard to the bulk LED substrate 100 illustrated in FIG. 3. At operation 4020 an array of dopant wells of the first dopant type (e.g. p-type) are diffused through the cladding layer 112 and an active layer 108. At operation 4030, an array of mesa trenches are formed through the dopant wells to form an array of mesa structures. Following the formation of the array of mesa structures, the patterned LED substrate may be bonded to a carrier substrate, followed by removal of the growth substrate and further processed to form an array of micro LEDs that are poised for pick up and transfer to a receiving substrate.

Figure 5:
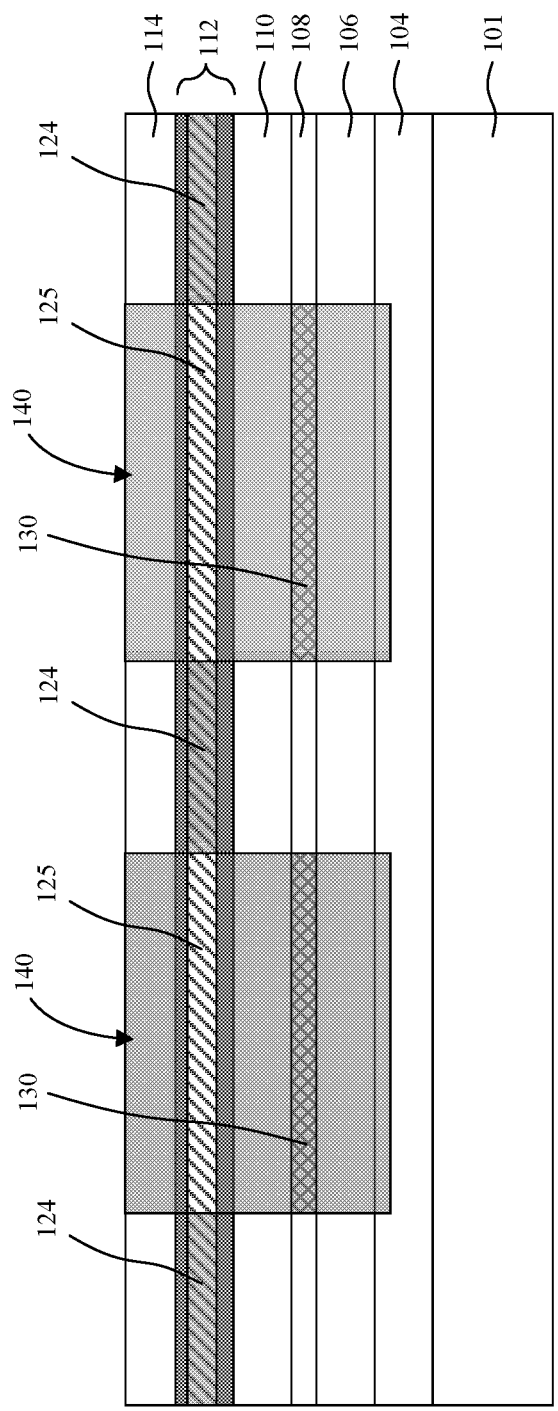
FIG. 5 is a schematic cross-sectional side view illustration of the formation of dopant wells in accordance with an embodiment.

FIG. 5 is schematic cross-sectional side view illustration of the formation of dopant wells 140 in accordance with an embodiment. In accordance with embodiments, the dopant wells 140 include a dopant concentration extending through the first cladding layer 112. As shown, the dopant wells, may extend through the contact layer 114, cladding layer 112, confinement layer 110, and active layer 108. The dopant wells may optionally extend through confinement layer 106, and optionally partially or completely through the cladding layer 104.

In accordance with embodiments, the dopant concentration may be p-type or n-type. The dopant wells 140 may additionally be formed using techniques such as diffusion from a film formed over the bulk LED substrate 100, or vapor diffusion. In some embodiments, the dopant concentration is p-type (e.g. Mg, Zn). In an embodiment encompassing diffusion of Zn, a high surface concentration of Zn is established from either a solid Zn-containing film applied to the surface, or by immersion in a Zn-rich vapor. The concentration gradient at the surface, along with an elevated temperature, will drive Zn diffusion into the underlying material.

Still referring to FIG. 5, the co-doped region 124 and dopant wells 140 overlap to form a net n-type blocking junction 125, and the co-doped region 124 that does not overlap the dopant wells 140 remains net p-type. In a specific embodiment, Zn diffusion facilitates the formation of group-III interstitials. As the Zn diffuses into the underlying substrate, it becomes more p-type. In response, even more group-III interstitials are formed. There exists a dynamic equilibrium governing the group-III interstitial formation and diffusion, whereby the group-III atoms are constantly jumping from a group-III lattice site to an interstice, diffusing interstitially, and dropping into a group-III site and reforming chemical bonds.

In accordance with embodiments, "kick-out" caused by the diffusing Zn atoms can cause Mg dopants from the cladding layer 112 and contact layer 114 to diffuse through the lattice and evaporate from the free surface resulting in a reduced, or possibly completely eliminated Mg concentration in the dopant wells 140. One aspect of embodiments is that the originally net p-type co-doped regions 124 are transformed to net n-type blocking junctions 125 by the diffusion of p-dopants. For example, the originally formed co-doped regions 124 are net p-type, for example, Mg=1× $10^{18}$ cm$^{-3}$ and Si=$5 \times 10^{17}$ cm$^{-3}$. The dopant wells 140 may have a dopant concentration of Zn=$1 \times 10^{17}$ cm$^{-3}$, for example. Thus, the dopant well 140 p-dopant concentration may be less than the n-dopant concentration in the co-doped region 124. Upon completion of the formation of dopant wells 140, even though additional p-dopants are being diffused, as a result of the "kick-out" mechanism, the Zn dopants may be driven out, resulting in lower overall p-type doping, and hence transformation of the affected portions of the co-doped regions 124 to net n-type blocking junctions 125.

In accordance with embodiments, "kick-out" caused by the diffusing Zn atoms can additionally promote movement of group-III atoms and homogenization of the atoms comprising the group-III sublattices in the dopant wells 140. In particular, this may cause heterostructure intermixing of the barrier layers and quantum well layers in the active layer 108, forming intermixed regions 130 of the active layer 108, which have a higher bandgap than the plurality of the interior quantum well layers 108A that do not overlap the dopant wells 140. Intermixed regions 130 (of the active layer overlapping the dopant wells 140) may additionally have a higher concentration of Al than each of the plurality of interior quantum well layers 108A. For example, the as-grown barrier layers 108B may have a higher Al concentration than the as grown quantum well layers 108A. Upon alloy intermixing, the intermixed regions may have a higher concentration of Al than the as grown quantum well layers 108A due to Al diffusion from the barrier layers 108B within the intermixed regions 130.

Referring now to FIGS. 6-7, an array of bottom conductive contacts 150 may be formed on the bulk LED substrate 100 between the array of dopant wells 140, and mesa trenches 160 formed partially or completely through the dopant wells 140 to form mesa structures 165. Etching may be performed using suitable techniques such as wet etching and dry etching. In an embodiment, mesa trenches 160 are formed by a first partial dry etch, then the wafer is transferred to a metal-organic chemical vapor deposition (MOCVD) chamber to complete etching of the mesa trenches 160. As illustrated, the mesa trenches 160 are formed through the contact layer 114, cladding layer 112, confinement layer 110, and active layer 108. The mesa trenches 160 illustrated additionally extend through the confinement layer 106 and partially or completely through the cladding layer 104.

Figure 8:
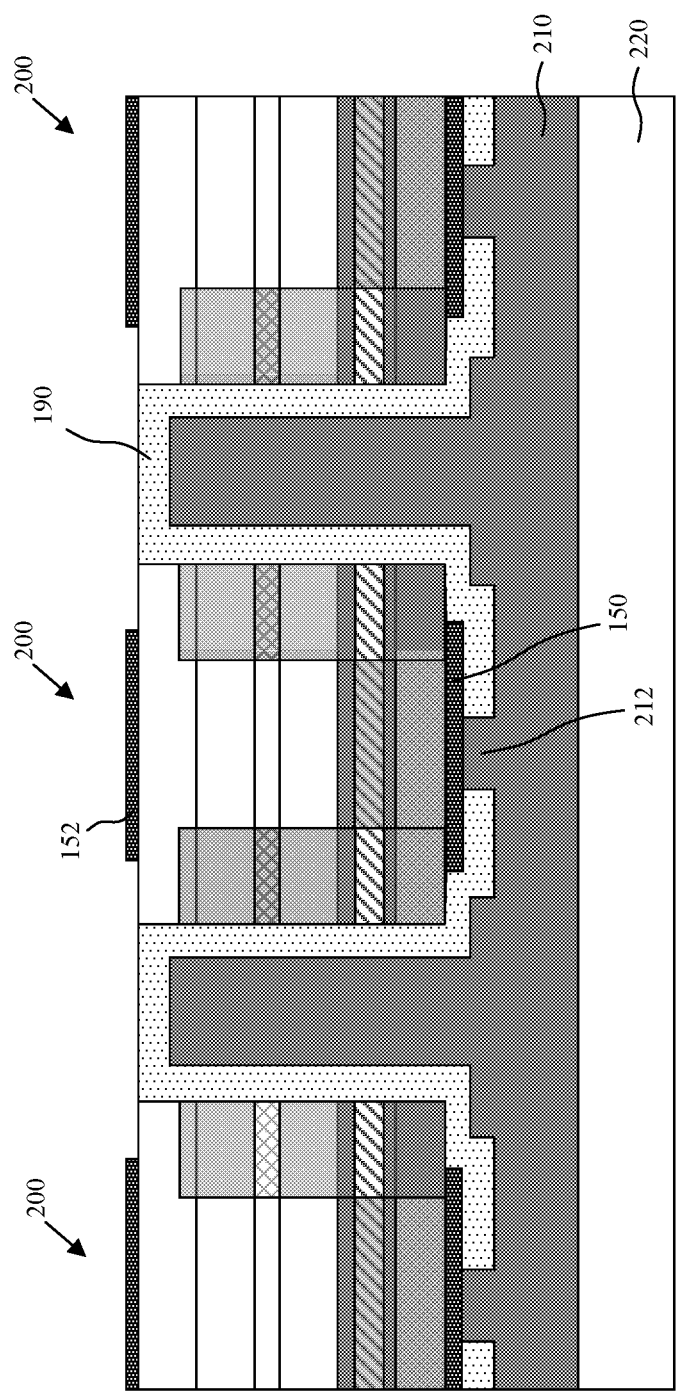
FIG. 8 is a schematic cross-sectional side view illustration an array of micro LEDs that are poised for pick up and transfer to a receiving substrate in accordance with an embodiment.

Following the formation of the array of mesa structures 165, the patterned LED substrate may be bonded to a carrier substrate 220, followed by removal of the growth substrate 101 and further processed to form an array of micro LEDs 200 that are poised for pick up and transfer to a receiving substrate as illustrated in FIG. 8. After formation of the bottom conductive contacts 150 and mesa trenches 160, a sacrificial release layer 190 (e.g. oxide or nitride material) may be formed over the patterned device layer and patterned to form openings over the bottom conductive contacts 150. The patterned structure is then bonded to a carrier substrate 220 with an adhesive bonding material to form a stabilization layer 210, including stabilization posts 212 within the openings in the sacrificial release layer 190. After bonding to the carrier substrate 220, the growth substrate 101 may be removed using a suitable technique such as laser lift-off, etching, or grinding to expose the device layer. Any remaining portions of the cladding layer 104 or contact layer connecting the separate mesa structures may then removed using etching or grinding to form laterally separate p-n diodes. An array of top conductive contacts 152 may then be formed on the exposed p-n diodes. The exposed sacrificial release layer 190 may be selectively etched at a later time prior to picking up and transferring the individual LEDs 200, for example, using an electrostatic transfer head array.

Referring now to FIG. 9A a schematic cross-sectional side view illustration of an LED including a revealed blocking junction and intermixed region is provided in accordance with an embodiment. FIG. 9B is a schematic cross-sectional side view illustration of the LED in FIG. 9A illustrating net dopant types in accordance with an embodiment. Also shown in FIG. 9B is the direction of current flow around the buried PNP junction within the current confinement region 145. In an embodiment, an LED 200 includes laterally opposite sidewalls 161, a first cladding layer 112 doped with a first dopant type (e.g. p-type) spanning between the laterally opposite sidewalls 161, an active layer 108 over the first cladding layer 112 and spanning between the laterally opposite sidewalls 161, and a second cladding layer 104 doped with a second dopant type (e.g. n-type, opposite the first dopant type) over the active layer 108 and spanning between the laterally opposite sidewalls 161. A co-doped region 124 (including dopants of the first dopant type and the second dopant type) is embedded within the first cladding layer 112 and spans between the laterally opposite sidewalls 161. The LED 200 additionally includes a current injection region 155 within the laterally opposite sidewalls, and a current confinement region 145 that completely laterally surrounds a portion of the current injection region, and spans along the laterally opposite sidewalls 161. The current confinement region 145 may characterized by a dopant concentration of the first dopant type (e.g. p-type) extending through the first cladding layer 112. In accordance with embodiments, the co-doped region 124 and the current confinement region 145 overlap to form a net second dopant type (e.g. n-type) blocking junction 125 within the first cladding layer 112. Further, the co-doped region 124 overlaps the current injection region 155 to form a net first dopant type region 123 (e.g. p-type) within the first cladding layer 112.

In an embodiment, the first cladding layer 112 is p-doped, for example with Mg, and the confinement region 145 dopant concentration includes Zn. Mg concentration within the first cladding layer 112 may be higher in the current injection region 155 than in the current confinement region 145. Additionally, the first cladding layer 112 may include a higher p-dopant concentration (e.g. Mg) in the current injection region 155 than in the current confinement region 145, which may include more Zn than Mg. For example, this may be a consequence of the "kick-out" mechanism.

In an embodiment, the current confinement region 145 and dopant concentration may additionally extend through the active layer 108 to form the intermixed region 130 that completely laterally surrounds a portion of the current injection region 155. For example, the active layer 108 may include a plurality of alternating barrier layers 108B and quantum well layers 108A, and the intermixed region 130 is characterized by a higher bandgap than the plurality of the quantum well layers 108A that overlap the current injection region 155.

As illustrated, the dopant concentration of the current confinement region 145 may extend through the contact layer 114, cladding layer 112, confinement layer 110, active layer 108, confinement layer 106, and optionally partially or completely through cladding layer 104. Each of the layers 104-114 may span between the laterally opposite sidewalls 161. As shown in FIGS. 9A-9B, the dopant concentration of the current confinement region 145 may not be high enough to change the net dopant type of cladding layer 104. Thus, while the dopant concentration (e.g. Zn, p-dopant) may extend into the cladding layer 104, the overlap may nevertheless remain n-type. However, this is not necessary.

Figure 10:
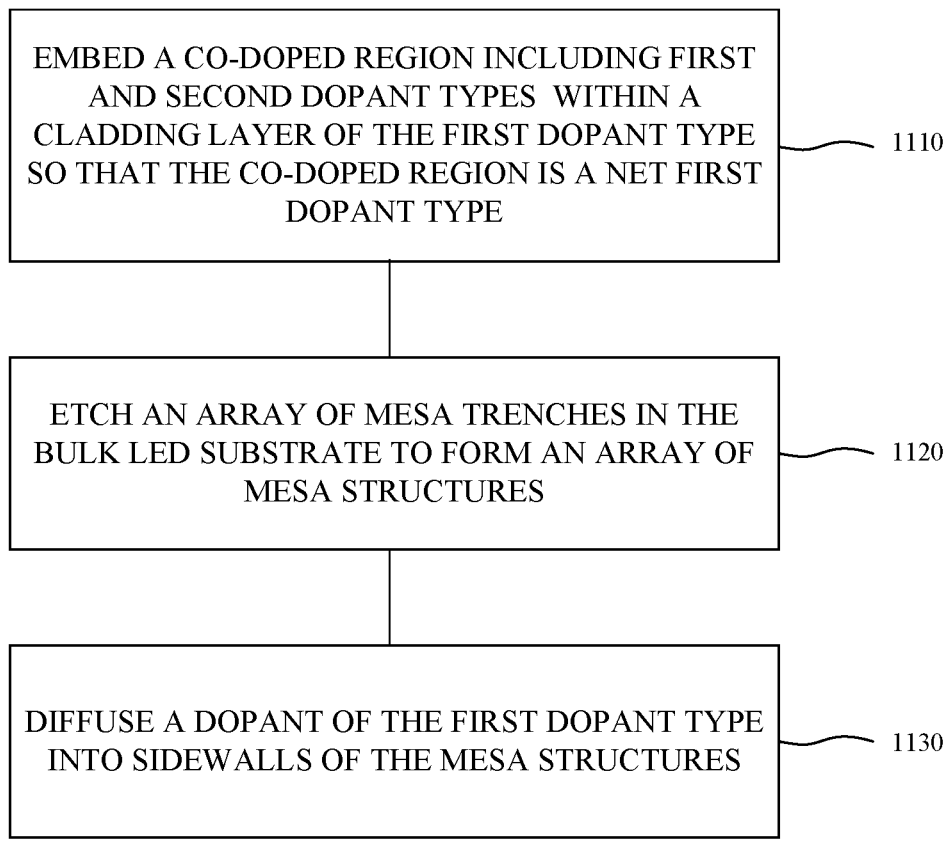
FIG. 10 is a flow chart illustrating a method of revealing a blocking junction with sidewall diffusion in accordance with an embodiment.
Figure 11:
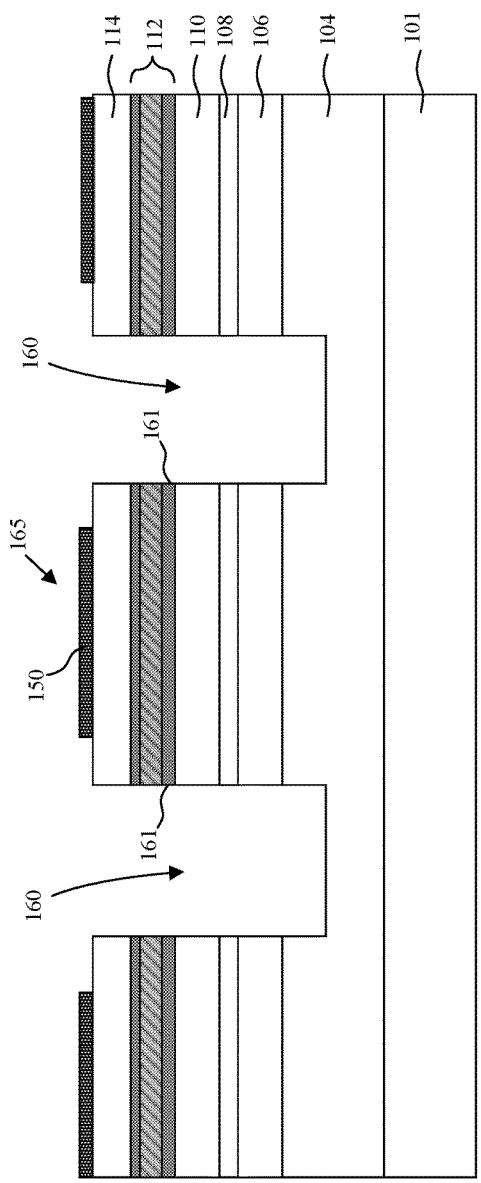
FIGS. 11-12 are schematic cross-sectional side view illustrations of revealing a blocking junction with sidewall diffusion in accordance with an embodiment.
Figure 12:
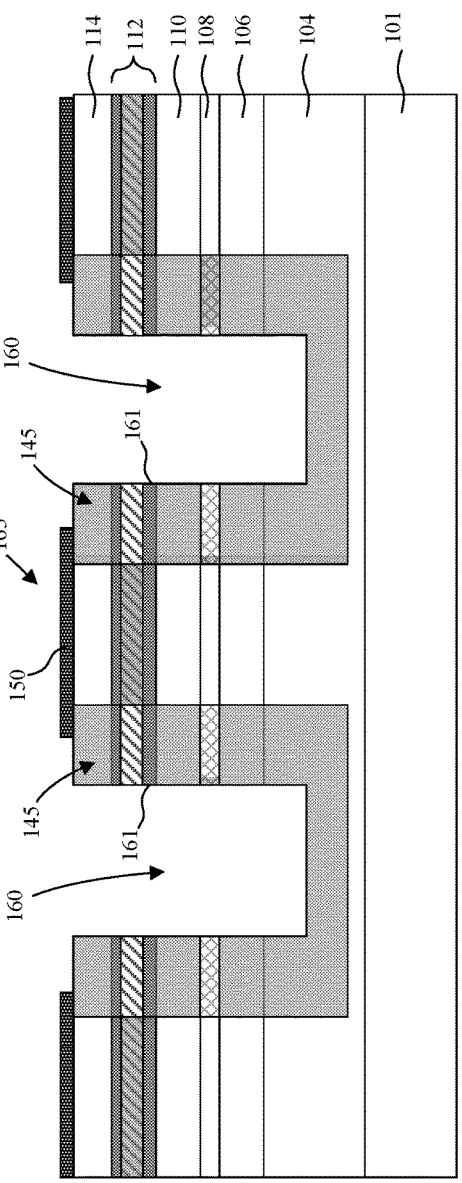

Referring now to FIG. 10 and FIGS. 11-12 a flow chart and schematic cross-sectional side view illustrations are provided for a method of revealing a blocking junction with sidewall diffusion in accordance with embodiments. At operation 1110 a co-doped region 124 including first and second dopant types is embedded within a cladding layer 112 of the first dopant type (e.g. p-type) so that the co-doped region is a net first dopant type (p-type). Operation 1110 was previously described with regard to the bulk LED substrate 100 illustrated in FIG. 3. At operation 1120, an array of mesa trenches 160 are formed in the bulk LED substrate 100 to form an array of mesa structures 165, as illustrated in FIG. 11. Mesa trenches 160 may be formed similarly as described with regard to FIG. 7. At operation 1130 a dopant concentration of the first dopant type (e.g. p-type) is diffused into sidewalls 161 of the mesa structures 165, including into the cladding layer 112 and active layer 108, to form confinement regions 145. The patterned LED substrate may be bonded to a carrier substrate, followed by removal of the growth substrate and further processed to form an array of micro LEDs 200 that are poised for pick up and transfer to a receiving substrate, as previously described with regard to FIG. 8, resulting in micro LEDs 200 similar to that previously described with regard to FIGS. 9A-9B.

Figure 13:
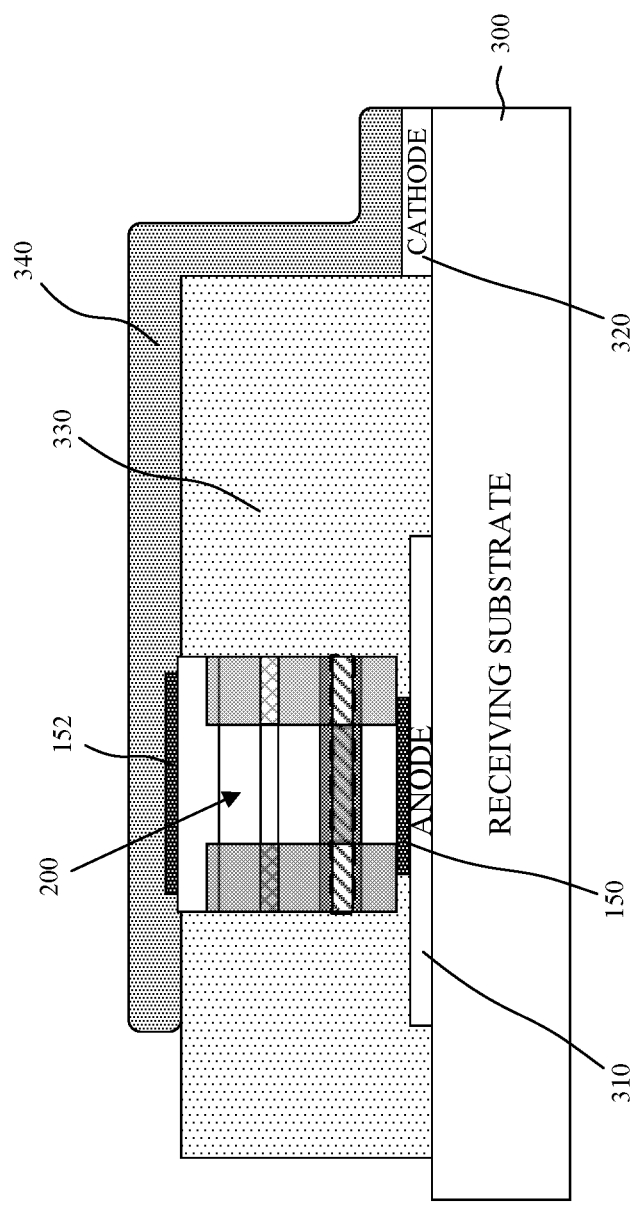
FIG. 13 is a schematic cross-sectional side view illustration of an LED integrated on a backplane in accordance with an embodiment.

FIG. 13 is a schematic cross-sectional side view illustration of an LED 200 bonded to a receiving substrate 300 in accordance with an embodiment. LED 200 may be any of the LEDs 200 described herein. The receiving substrate 300 may be a display backplane. As shown, the LED 200 is a vertical LED, with the bottom conductive contact 150 bonded to an electrode (e.g. anode) 310 with a bonding material, such as a solder material. In an embodiment, the LED 200 is bonded to an electrode (e.g. pixel electrode) 310 on a display substrate. Sidewalls of the LED 200 may be surrounded by a dielectric material 330. The dielectric material may serve several functions such as securing the LED 200 to the receiving substrate 300, as well as providing step coverage for a top conductive layer 340, such as a conductive oxide or conductive polymer, used to electrically connect the top conductive contact 152 to an electrode (e.g. cathode) 320. For example, the dielectric material 330 may be an oxide, or polymer material. The dielectric material 330 may additionally protect against electrical shorting between the top conductive layer 340 and sidewalls of the LED.

Figure 14:
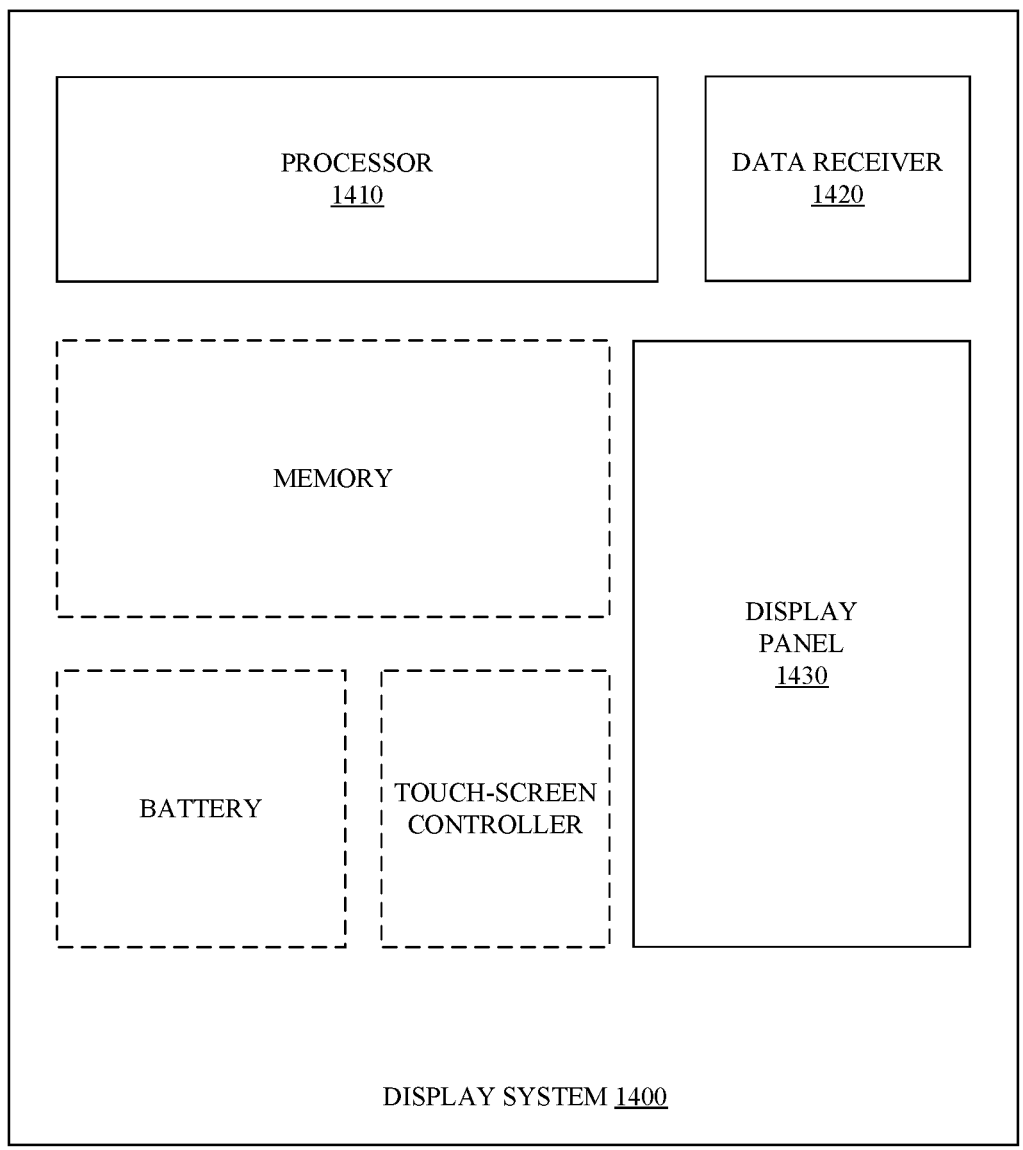
FIG. 14 is a schematic illustration of a display system in accordance with an embodiment.

FIG. 14 illustrates a display system 1400 in accordance with an embodiment. The display system houses a processor 1410, data receiver 1420, and one or more display panels 1430 which may include an array of LEDs 200 bonded to a backplane (e.g. 300). The display panels 1430 may additionally include one or more display driver ICs such as scan driver ICs and data driver ICs. The data receiver 1420 may be configured to receive data wirelessly or wired. Wireless may be implemented in any of a number of wireless standards or protocols.

Depending on its applications, the display system 1400 may include other components. These other components include, but are not limited to, memory, a touch-screen controller, and a battery. In various implementations, the display system 1400 may be a wearable device (e.g. watch), television, tablet, phone, laptop, computer monitor, kiosk, digital camera, handheld game console, media display, ebook display, or large area signage display.

In utilizing the various aspects of the embodiments, it would become apparent to one skilled in the art that combinations or variations of the above embodiments are possible for fabricating LEDs including one or more current confinement structures. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A light emitting diode comprising:
    laterally opposite sidewalls;
    a first cladding layer spanning between the laterally opposite sidewalls, and doped with a first dopant type;
    an active layer over the first cladding layer and spanning between the laterally opposite sidewalls;
    a second cladding layer over the active layer and spanning between the laterally opposite sidewalls, and doped with a second dopant type opposite the first dopant type; and
    a co-doped region embedded within the first cladding layer and spanning between the laterally opposite sidewalls, and including dopants of the first dopant type and the second dopant type;
    a current injection region within the laterally opposite sidewalls; and
    a current confinement region laterally surrounding the current injection region, and spanning along the laterally opposite sidewalls, wherein the current confinement region comprises a dopant concentration of the first dopant type extending through the first cladding layer; and
    wherein the current confinement region dopant concentration extends through and overlaps the co-doped region to form a net second dopant type blocking junction within the first cladding layer, and the current confinement region dopant concentration surrounds a net first dopant type region of the co-doped region that is within first cladding layer and overlaps the current injection region.

2. The light emitting diode of claim 1, wherein the first cladding layer is p-type doped.

3. The light emitting diode of claim 2, wherein the first cladding layer p-type doped with Mg.

4. The light emitting diode of claim 3, wherein the current confinement region dopant concentration comprises Zn.

5. The light emitting diode of claim 4, wherein Mg concentration within the first cladding layer is higher in the current injection region than in the current confinement region.

6. The light emitting diode of claim 1, wherein the first cladding layer comprises a higher p-type dopant concentration in the current injection region than in the current confinement region.

7. The light emitting diode of claim 1, wherein the first cladding layer is p-type doped, and further comprising:
    a bottom confinement layer over the p-type doped first cladding layer, and spanning between the laterally opposite sidewalls and the current injection region; and
    a top confinement layer on the active layer, and spanning between the laterally opposite sidewalls and the current injection region.

8. The light emitting diode of claim 7, wherein the current confinement region dopant concentration extends through the p-type doped first cladding layer, the bottom confinement layer, the active layer, and the top confinement layer.

9. The light emitting diode of claim 1, wherein:
    the current confinement region dopant concentration extends through the active layer;
    the active layer comprises a plurality of alternating barrier layers and quantum well layers; and
    the current confinement region overlaps an intermixed region of the active layer, which has a higher bandgap than the plurality of the quantum well layers that overlap the current injection region.

10. A display device comprising:
    a display substrate;
    pixel electrode;
    an LED bonded to the pixel electrode, the LED comprising:
        laterally opposite sidewalls;
        a first cladding layer spanning between the laterally opposite sidewalls, and doped with a first dopant type;
        an active layer over the first cladding layer and spanning between the laterally opposite sidewalls;
        a second cladding layer over the active layer and spanning between the laterally opposite sidewalls, and doped with a second dopant type opposite the first dopant type; and
        a co-doped region embedded within the first cladding layer and spanning between the laterally opposite sidewalls, and including dopants of the first dopant type and the second dopant type;
        a current injection region within the laterally opposite sidewalls; and
        a current confinement region laterally surrounding the current injection region, and spanning along the laterally opposite sidewalls, wherein the current confinement region comprises a dopant concentration of the first dopant type extending through the first cladding layer; and wherein the current confinement region dopant concentration extends through and overlaps the co-doped region to form a net second dopant type blocking junction within the first cladding layer, and the current confinement region dopant concentration surrounds a net first dopant type region of the co-doped region that is within first cladding layer and overlaps the current injection region.

11. The light emitting diode of claim 10, wherein the first cladding layer is p-type doped.

12. The light emitting diode of claim 11, wherein the first cladding layer p-type doped with Mg.

13. The light emitting diode of claim 12, wherein the current confinement region dopant concentration comprises Zn.

14. The light emitting diode of claim 13, wherein Mg concentration within the first cladding layer is higher in the current injection region than in the current confinement region.

* * * * *